United States Patent
Rao et al.

(10) Patent No.: US 6,725,437 B1
(45) Date of Patent: Apr. 20, 2004

(54) PERFORMANCE GROUPS-BASED FAST SIMULATED ANNEALING FOR IMPROVING SPEED AND QUALITY OF VLSI CIRCUIT PLACEMENT

(75) Inventors: Prahlada B Rao, Andhra Pradesh (IN); Srinivasa R Patil, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/321,141

(22) Filed: Dec. 17, 2002

(51) Int. Cl.$^7$ ................................................ G06F 9/45

(52) U.S. Cl. ............................ 716/9; 716/10; 703/13; 703/14

(58) Field of Search ..................... 716/9, 10; 703/13, 703/14

(56) References Cited

U.S. PATENT DOCUMENTS

| | | | |
|---|---|---|---|
| 5,745,735 A | | 4/1998 | Cohn et al. |
| 5,796,625 A | * | 8/1998 | Scepanovic et al. ............ 716/9 |
| 6,389,582 B1 | * | 5/2002 | Valainis et al. ................. 716/9 |
| 6,442,743 B1 | * | 8/2002 | Sarrafzadeh et al. .......... 716/10 |

OTHER PUBLICATIONS

Mallela and Grover (see Sivanarayana Mallela, LK Grover, *Clustering* Based Simulated Annealing for Std Cell Placement, In Proc of 25th DAC Conf, pp 312–316, 1988 ).

John A Chandy and P Banerjee in Parallel Simulated Annealing Strategies for VLSI Cell Placement, Proc. of 9th International Conference on VLSI Design, Bangalore, India, Jan. 1996.

Jonas Knopman, Parallel Simulated Annealing: an Adaptive Approach, Federal University of Rio de Janeiro—NCE/ UFRJ Júlio S. Aude—Federal University ofRio, 1997 http.// jpds.eec2.unm.edu/1997/s14/257_pdf.

* cited by examiner

Primary Examiner—Stacy A. Whitmore
(74) Attorney, Agent, or Firm—Anthony V. S. England; T. Rao Coca

(57) ABSTRACT

The present invention provides Performance groups based Simulated Annealing (PGSA) for VLSI circuit placement. This method reduces the computation time required for VLSI circuit placement using Simulated Annealing by reducing the size of the placement problem by forming Performance groups while maintaining a high quality of the final placement solution. Performance groups are formed by picking circuits connected by a net and counting their local-net-count. These circuits are then grouped based on certain pre-determined conditions and placed suitably using simulated annealing based placement approach.

33 Claims, 6 Drawing Sheets

PERFORMANCE GROUPS-BASED FAST SIMULATED ANNEALING FOR IMPROVING SPEED AND QUALITY OF VLSI CIRCUIT PLACEMENT

FIELD OF THE INVENTION

The present invention relates to an improved circuit placement in VLSI layout. In particular, it relates to performance groups-based fast simulated annealing for improving the speed and quality of VLSI circuit, placement.

BACKGROUND OF THE INVENTION

A typical VLSI circuit comprises a set of modules, a set of signals (or netlist) interconnecting terminals on the periphery of these modules, and a set of locations where these modules can be placed. The VLSI Placement problem is to assign each module to a unique location, i.e. construct a layout, such that an objective function is optimized. The objective function maximizes circuit performance by minimizing path length interconnecting the various circuit elements, ensuring routing of all nets, within a minimum computational time and system memory usage.

Simulated Annealing (SA) is a probabilistic, iterative improvement technique, used to solve many combinatorial optimization problems. This technique has also been applied to solve the VLSI placement problem. The iterative improvement approach used in this technique always provides a scope for further optimisation once the algorithm determines a local optimal. The SA Approach allows accepting states with higher energy, in the anticipation of improving upon a local optimal, and obtaining a Global Optimal Solution as shown in FIG. 1.

The inherent problem with Simulated Annealing is that it requires excessive computation time and is therefore, very slow. Several techniques have been adopted to improve the speed of the algorithm while maintaining a good quality of the final solution.

One such technique was proposed by Mallela, and Grover (see Sivanarayana Mallela, L K Grover, Clustering Based Simulated Annealing for Std Cell Placement, In Proc of 25th DAC Conf, pp 312–316, 1988.) to improve the performance of SA-based Standard Cell Placement using Clustering. The clustering technique discussed by Mallela and Grover deals with forming clusters of circuit elements wherein the circuit elements to be clustered are searched based on—number of local nets, common nets, common net fanout, terminal count . . . etc., among all the circuit elements of the design. A cluster of two circuit elements is formed, followed by a cluster of clusters. The method uses SA to find suitable regions on the chip for the clusters, and then to place the circuit elements within clusters. This approach works well for smaller designs having a few thousand circuits, but fails as the design size grows to a few million. The reason for the failure is that the number of comparisons required to pick the circuits for cluster is of the Order of $(n^2)$. Furthermore, the scope of the search while forming clusters using this method extends to the entire circuit set of the design and therefore, requires significantly greater processing.

Another approach that has been used to speed up the SA algorithm is implementing the algorithm in parallel using multiple processors. One such parallelization approach is described by John A Chandy and P Banerjee in Parallel Simulated Annealing Strategies for VLSI Cell Placement, Proc. of 9th International Conference on VLSI Design, Bangalore, India, January 1996. They discuss parallelizing methods for Simulated Annealing based VLSI Cell Placement problem for reducing the inordinate amount of time taken for VLSI circuit Design. An alternative method for parallelization is described by Jonas Knopman in his paper Parallel Simulated Annealing: an Adaptive Approach, Federal University of Rio de Janeiro—NCE/UFRJ Júlio S. Aude—Federal University of Rio, 1997 http://ipdps.eece.unm.edu/1997/s14/257.pdf. The paper presents a Simulated Annealing algorithm applied to the placement of circuits in VLSI. This algorithm uses different parallelization approaches for high and low temperature values of the annealing process. The algorithm used for low temperatures is an adaptive version of the speculative algorithm. The number of processors allocated to the solution of the placement problem and number of moves evaluated per processor between synchronization points changes with the temperature. But the drawback of the parallel approaches is that SA is inherently a sequential algorithm and therefore, is not amenable for an efficient parallel implementation. As a result, most of these approaches have not been very successful in speeding up the VLSI circuit placement using SA.

U.S. Pat. No. 5,745,735 describes a method of optimizing by SA using a spatial metric to localize the simulated annealing temperature, the move set and the objects on which the moves operate. The method keeps a local history of the optimization process. The localization allows the SA process to adaptively control the annealing schedule of each local region independently. This method optimizes the annealing schedule but does not reduce the problem size seen by the annealing process to reduce the computational time while maintaining the quality of placement.

SUMMARY OF THE INVENTION

The object of this invention is to obviate the above drawbacks in the prior art and improve the speed of VLSI circuit placement by reducing the computational time required.

Another object of the invention is to improve the quality of VLSI circuit placement.

Yet another object of the invention is to enable automatic placement of large VLSI circuit designs. To achieve these objectives the present invention provides a Performance Groups-Based Fast Simulated Annealing method for improving speed and quality of VLSI circuit placement. A target objective cost function incorporating the influence of all the significant parameters is defined along with the initial control parameter for circuit placement. Performance groups are formed using selected circuit elements of the VLSI circuit according to predetermined criteria and an initial placement configuration of these performance groups is done randomly.

Subsequently, the value of the initial control parameter is increased to a pre-determined level according to a predetermined schedule. The placement configuration is then perturbed randomly with a high degree of freedom to get a new configuration by altering the configuration of randomly selected circuits. The cost of the new configuration is determined using the objective cost function and the new configuration is accepted when it has a lower associated cost as compared to the previous configuration while it is probabilistically accepted when it has a higher associated cost. The value of the control parameter is decreased by a pre-determined amount according to a predetermined schedule. These steps are repeated for a pre-determined number of times for each control parameter value until a configuration having a lower cost is not detected or the solution cost does not change for a pre-determined number of iterations.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative preferred embodiment when read in conjunction with the accompanying drawings, wherein:

DETAILED DESCRIPTION

The present invention provides an improved method for VLSI circuit Placement (PGMCPlace algorithm) for improving SA-based circuit placement. MCPlace, is a placement tool based on Simulated Annealing used in IBM's ChipBench suite. This invention incorporates the concept of Clusters of Movable circuit elements (Performance Groups) into MCPlace to enhance its speed. Performance Group based Fast Simulated Annealing for VLSI-Placement (PGMCPlace) described herein, is an enhanced Simulated annealing based Placement (MCPlace) Tool. PGMCPlace improves the speed of MCPlace by reducing the run time and also improves the quality of solutions for Larger Designs. After testing PGMCPlace on Large/Small Designs, it was observed that the run time is reduced approximately by 20–25%, while the quality of solutions improved by 15–42% compared to that of original MCPlace.

Grouping circuit elements together creates performance Groups. All circuit elements connected by a single net are chosen, and their local-net-count is determined. A Local net is defined as a set of two circuit elements having wire connectivity between them. The number of wires running between them is defined as the local-net-count.

A Performance Group circuit is initiated by a circuit element called the Seed Circuit, while the circuit elements that gets associated with this Seed Circuit are called Stitch Circuits. Thus, each Performance Group is a combination of Seed and Stitch circuits, and it is represented by the Seed Circuit. The SA in PGMCPlace algorithm handles circuits of a Performance Group as a single circuit element. Thus, PGMCPlace reduces the number of circuit-elements required to be handled by its SA algorithm. As a result, of the decrease in the input size, the computational run time required for circuit placement using the PGMCPlace algorithm reduces.

In Physical design flow, Performance groups are formed after determining all nets of the VLSI, and establishing the Floor plan for these nets. Floor planning deals with the placement of logic blocks into the overall design such that a pre-determined Objective function is optimized. Floor planning helps to assign an area budget can be assigned to the various modules and to estimate the overall size of the chip. After this logical design has been established in the floor planning stage, PGs are formed. Following which the actual placement configuration of the various VLSI circuit elements is determined. The total number of PGs formed is less than half of the total movable circuit elements present in the design. Therefore, the integration of Performance groups into the early design stages reduces the effective number of circuit elements seen by PGMCPlace, and thereby offer benefits such as reduced computational time and better quality of the final placement solution.

Figure 1:
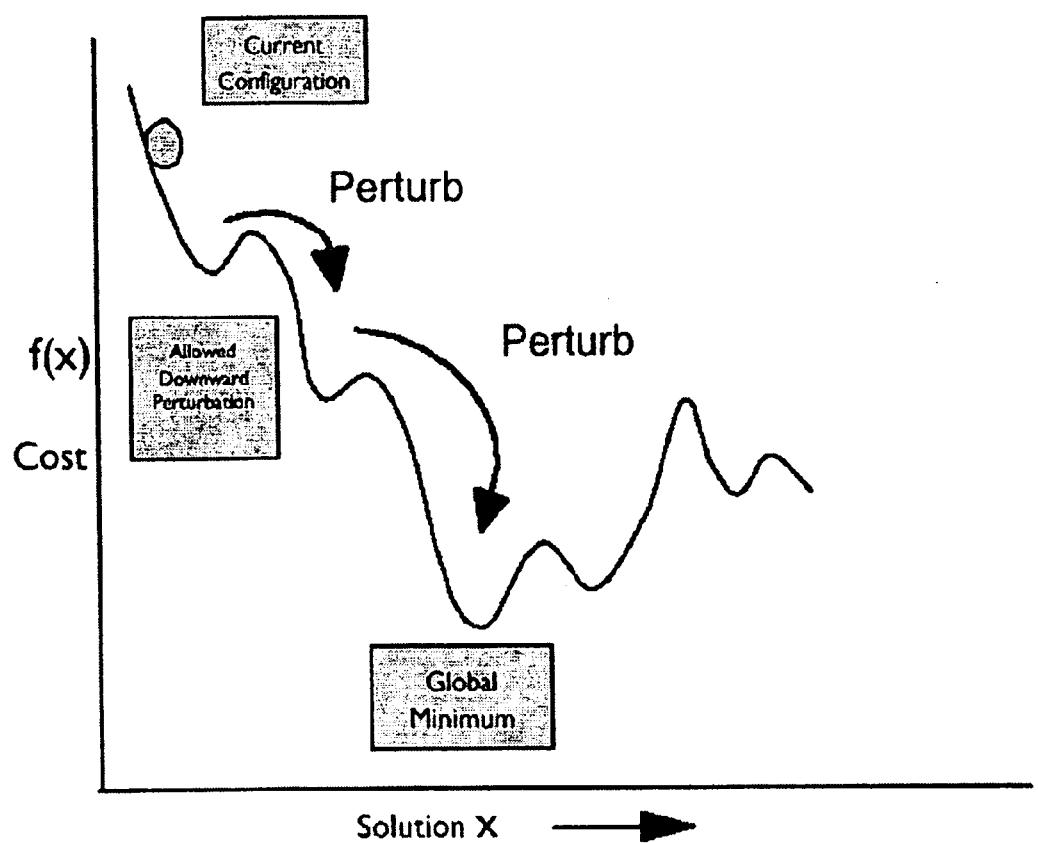
FIG. 1 shows a graph illustrating the conventional Simulated Annealing approach.
Figure 2:
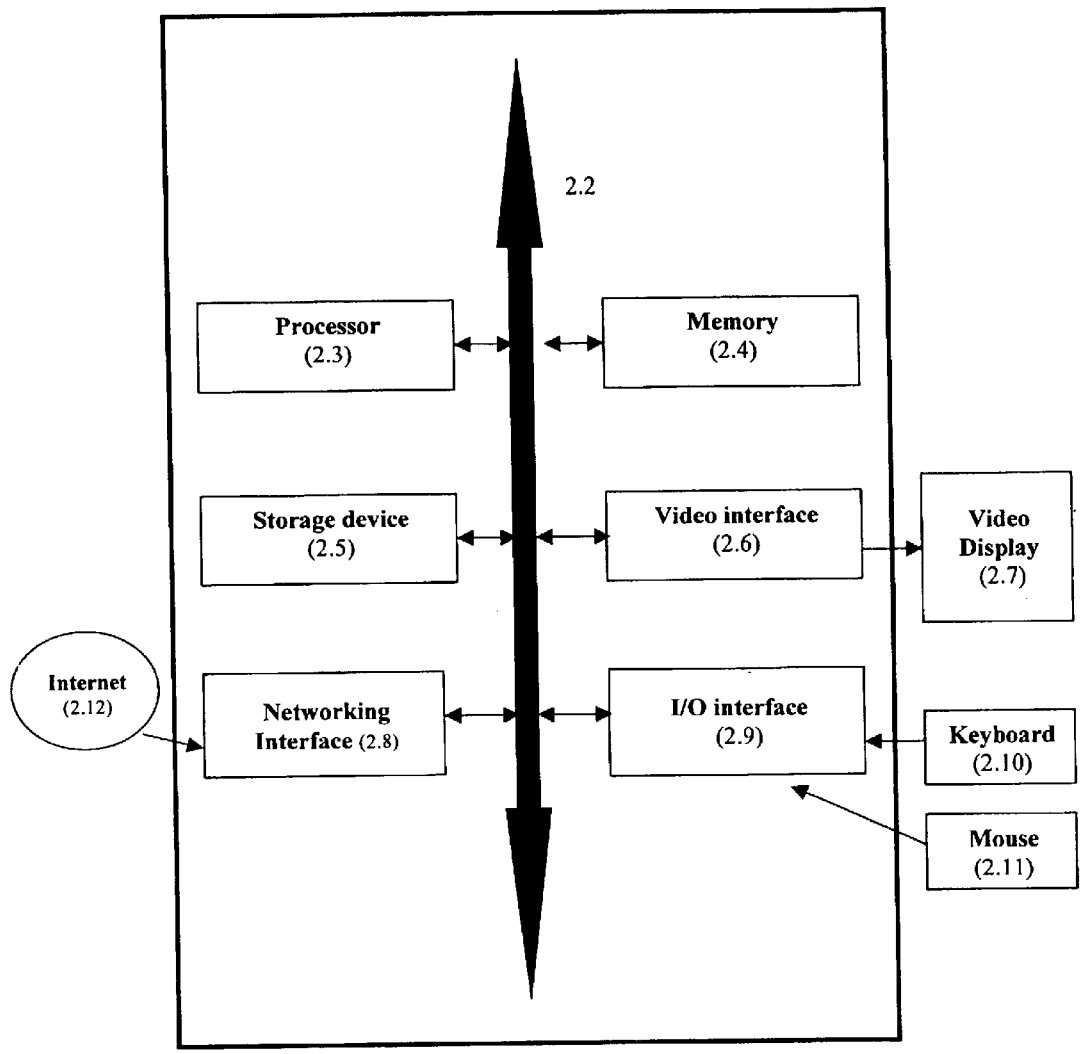
FIG. 2 is a block diagram depicting the internal structure of a general computing system on which the invention might be practiced.

FIG. 2 is a block diagram that illustrates a typical device incorporating the invention. The device (2.1) consists of various subsystems interconnected with the help of a system bus (2.2). Each device (2.1) incorporates networking interface (2.8) that is used to connect the device to various networks such as a LAN, WAN or the Internet (2.12).

The instructions encoded in the various means used in the invention are stored in the storage device (2.5) and are transferred to the memory (2.4) through the internal communication bus (2.2) when the program is executed. The memory (2.4) holds the current instructions to be executed by the processor (2.3) along with their results. The processor (2.3) executes the instructions in the objective cost function defining means and the control parameter determining means by fetching them from the memory (2.4) to ascertain the target objective cost function and an initial control parameter. The processor (2.3) could be a microprocessor in case of a PC or a workstation, a dedicated semiconductor chip and the like. During the execution of the means, the keyboard (2.10), mouse (2.11) and other input devices connected to the computer system through the I/O interface (2.9) are used to enter the details about the cost function and the control parameter.

The processor (2.3) then executes the performance group creating means for creating Performance groups according to pre-determined criteria. Following which, the placement configuration creating means are executed for generating an initial placement configuration of the performance groups based on the initial control parameters. The initial placement configuration that is generated is subsequently improved upon by perturbing, unclustering and configuration accepting means to reach an optimal configuration. Any deficiencies in the placement of circuit elements in final configuration are corrected by executing the legalising means. The details of the final optimized placement configuration are displayed to the designer through the video display (2.7) connected to the computing device through the video interface (2.6).

Those of ordinary skill in the art will appreciate that the means herein-described are instructions for operating on the computing system. The means are capable of existing in an embedded form within the hardware of a computing system or may be embodied on various computer readable media. The computer readable media may take the form of coded formats that are decoded for actual use in a particular information processing system. Computer program means or a computer program in the present context mean any expression, in any language, code, or notation, of a set of instructions intended to cause a system having information processing capability to perform the particular function either directly or after performing either or both of the following:

a) conversion to another language, code or notation b) reproduction in a different material form.

The depicted example in FIG. 2 is not meant to imply architectural limitations and the configuration of the incorporating device of the said means may vary depending on the implementation. The invention can be realized in hardware, software, or a combination of hardware and software. Any kind of computer system or other apparatus adapted for carrying out the means described herein can be employed for practicing the invention. A typical combination of hardware and software could be a general purpose computer system with a computer program that when loaded and executed, controls the compute system such that it carries out the means described herein.

Figure 3:
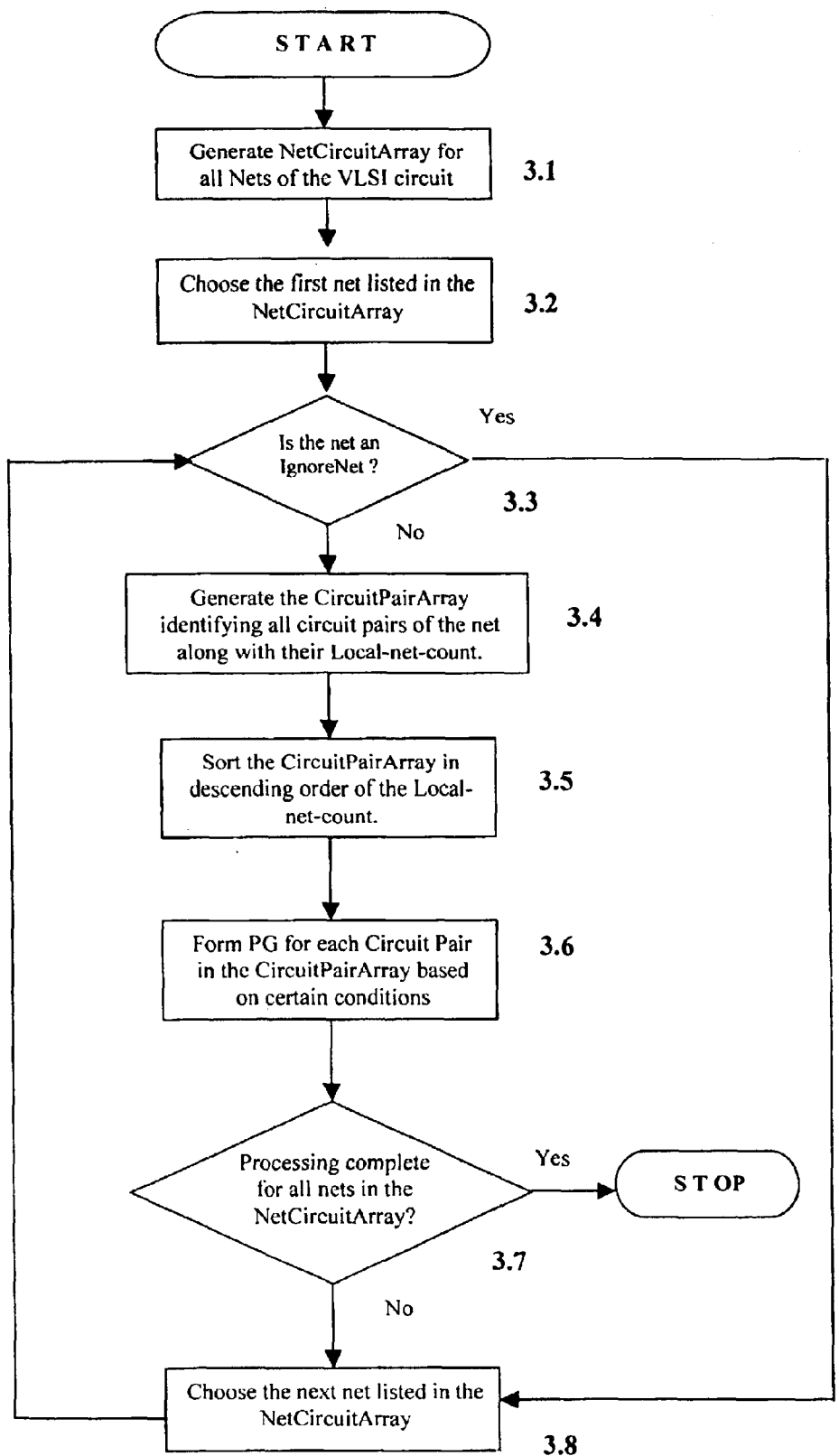
FIG. 3 shows the Flow Chart for Performance Group formation step of PGMCPlace.

FIG. 3 shows a flow chart to Performance group (PG) formation Algorithm. The first step in the algorithm is to generate a NetCircuitArray (3.1) to identify all the nets of the VLSI circuit. After this the first net from the NetCircuitArray is chosen (3.2) and a CircuitPairArray is generated for this net (3.4) if the net is not an IgnoreNet (3.3). An IgnoreNet is a net that is not handled at the Placement stage and is marked by the Designer to be handled later separately. IgnoreNets include ClockNets (nets having larger fanout), ScanNets and Re-PoweredNets. If an IgnoreNet is found, the algorithm flow is redirected to step 3.8 wherein the next net in the NetCircuitArray is chosen for generating the CircuitPairArray. The CircuitPairArray identifies all circuit element pairs of the net along with their local-net-count. The next step of the algorithm is sorting the CircuitPairArray (3.5) in descending order of local-net-count after it contains information about all the circuit element pairs of the net. Subsequently, Performance Groups are formed (3.6) for each circuit element Pair in the CircuitPairArray based on certain conditions. The conditions for PG formation are as follows:

1. A circuit element that is part of one PG is not eligible to participate again in the formation of another PG. There should not be any circuit replication among PGs. A circuit element can not participate in more than one Performance Group.
2. A circuit element may be present in more than one net.
3. The number of comparisons required to form PGs of a net is n(n−1)/2, where n is number of circuit element of a net. Thus in FIG. 4, the number of comparisons required is 6 because here 'n' is equal to 4.
4. Single circuit element Performance Group should be avoided.

The above conditions ensure that two circuit elements, having a high local-net-count, that have not participated earlier in a PG formation are bound together as a single PG. After which, these two circuit elements are eliminated for further PG formations and this process is repeated for all circuit elements of all nets.

Following the PG formation for all the circuit elements of the first net, a check is made to ensure whether any net in the NetCircuitArray is left to be processed (3.7). If an unprocessed net is found, the PG formation process is repeated for this net (3.8) else, the process is terminated.

Figure 4:
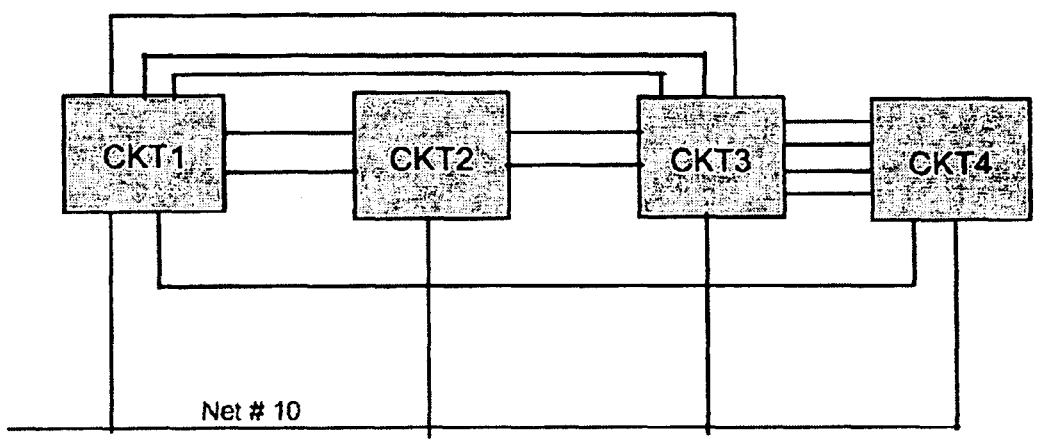
FIG. 4 shows the illustration for formation of Performance groups from a circuit net

FIG. 4 illustrates Performance group formation for a net. In the figure, Net#10 has four circuits CKT1, CKT2, CKT3 and CKT4 connected by it. The circuit pairs for Net #10 along with their local-net-count are given below:

| Circuit Pair | Local-net-count |
| --- | --- |
| (CKT1, CKT2) | 2 |
| (CKT1, CKT3) | 3 |
| (CKT1, CKT4) | 1 |
| (CKT2, CKT3) | 2 |
| (CKT2, CKT4) | 0 |
| (CKT3, CKT4) | 4 |

A priority list of the circuit elements and their local-net-count is maintained for Net#10. It is arranged in the descending order of the local-net-count. The formation of PGs begins with the circuit elements having the highest local-net-count. Therefore, for the circuit elements of Net#10 shown in FIG. 4, the first PG (PG1) is formed with the circuit elements (CKT3,CKT4) as it has the highest local-net-count of 4. These Circuits (CKT3,CKT4) are not considered in the subsequent PG formation process. The next PG is formed with circuit pair (CKT1,CKT2) because even though circuit pair (CKT1,CKT3) has the second highest local-net-count of 3, CKT3 is already a part of PG1 and cannot be a part of any other PG. Thus, only two Performance Groups are formed with circuit elements of Net#10.

The Performance Groups based VLSI circuit placement algorithm (PGMCPlace) provided by the present invention incorporating the concept of PGs with the conventional Simulated annealing is listed below:

---

Algorithm PGMCPlace

---

$T_0$ = Initial Temperature
Create_Performance_Groups ( )
Solution = InitPlacement ( )
While (T <= $T_{warm}$) {
    $Solution^1$ = GenerateNewPlacement(Solution)
    T = SCHEDULE $_{Warming}$(T);
}
While (TC) {
    While (inner_loop_criterion=FALSE) {
        $Solution^1$ = GenerateNewPlacement (Solution)
        $\Delta Cost$=Evaluate($Solution^1$) − Evaluate(Solution)
        IF ($\Delta Cost$ < 0) THEN
            Solution = $Solution^1$
        ELSE IF (random (0, 1) > $e^{-\Delta Cost/T}$) THEN
            Solution = $Solution^1$
            T = SCHEDULE $_{Cooling}$ (T)
        }
}

---

Algorithm 1.0 Performance Group-based VLSI Circuit Placement Algorithm (PGMCPlace)
Where,
$T_0$ = Initial Temperature
$T_F$ = Final Temperature
$T_{warm}$ = Final Warming Temperature
$T_{cool}$ = Final Cooling Temperature
T = Current Temperature
TC = Termination Condition
$\Delta Cost$ = NewCost − OldCost
Schedule $_{Cooling}$/Schedule $_{Warming}$: Cooling/Warming Schedules of Annealing.

The terms/control parameters used in PGMCPlace Algorithm are explained below:
    Initial/Final Temperatures: are the initial and final temperature used in the Temperature schedule.
    Inner_loop_criterion: The number of trials to be conducted at each temperature.
    Perturb: The Process (Move or Swap) used for generating new configurations.
        Move: Displace a circuit element to a new position.
        Swap: Exchange two circuit element positions.
    MoveRange: The Max Manhattan Distance expressed in Placement Slot Units that a circuit can be moved from its current Placement Slot. This number cannot exceed K, where K=#rows+#columns in the design.
    Cost: The cost function used to evaluate the new placement.
    Temperature Schedule: It finds the next operating temperature schedule. SA based optimization guides the annealing process and controls the number of moves accepted/rejected at each temperature.
    Initial Placement: A random placement solution generated initially by the PGMCPlace algorithm by allocating Placement slots (CELL) to all movable circuit elements of a design randomly, ensuring that the circuit's elements do not cross the chip boundaries. The Simulated Annealing based Placement Algorithm starts with this Initial Placement solution.

Performance Group (PG): A group of circuit elements clustered as one unit based on certain performance criteria. These criteria can be used either to enforce a spatial constraint or relational constraint on the objects of the problem space.

Seed Circuit: The representative circuit element of a Performance Group.

Stitch Circuit: The circuit element associated with a Seed circuit.

Local Nets: Nets between a Pair of circuit elements.

The PGMCPlace starts with an Initial_Placement wherein a placement solution is generated randomly. In PGMCPlace, SA is implemented in two phases Warming Phase, and Cooling Phase. After Initial Placement, the configuration is warmed up to the desired high temperature $T_{warm}$, before the Cooling Phase starts.

Warming Phase

The Warming Phase precedes the annealing phase to warm the design configuration to a desired high temperature. It amounts to running SA with raised temperatures, which in effect scrambles the design to produce a new configuration different from the initial one. The purpose of this Warming Phase is to establish a higher initial temperature for the cooling phase ensuring:

Independence from the initial; placement configuration generated by the Initial-Placement, and High mobility without rising the Initial temperature so high that cooling is unable to make sufficient progress within a reasonable amount of time.

The initial placement configuration is disturbed by raising the temperature, as annealing is required to start with desired high temperature T. Following which for each temperature, the placement configuration is perturbed randomly with high degree of freedom. The process can be understood by an analogy of heating iron, so as to bend/modify it later according to the required shape during annealing/cooling phase later. The placement configuration is aimed to a desired high temperature, so that the perturbed configuration has a higher probability of being accepted even if it degrades the cost of placement.

Cooling Phase (Annealing)

The Cooling phase does the annealing for SA. Annealing starts with high temperature reached in the preceding Warming phase. The VLSI placement configuration is shuffled or perturbed by randomly displacing a moveable circuit to an empty location or interchanging two moveable circuits, to get a new configuration for each temperature during the annealing phase. The quality of the new configuration is evaluated in terms of its associated costs using Eqn-1.

COST=$W1$*Regional Balance+$W2$*Capacitance+ $W3$*CellOverlaps+$W4$*X-WireDensity+$W5$*X-WireLength+ $W6$*Y-WireDensity+$W7$*Y-WireLength  Eqn 1

Where, W1 . . . W7 are weightages assigned to various parameters

The Quality of a solution is a measure of goodness/badness of the placement solution. Higher the placement score, lower the quality of the solution and vice versa. A new configuration is accepted, if its associated cost is lesser than that of the previous configuration, else it is accepted probabilistically using Eqn-2.

Probability of Acceptance=$K1 * e^{-\Delta Cost/T}$  Eqn 2

Where, $\Delta$Cost=NewCost−OldCost

This process is repeated by changing the temperatures, till the Termination Condition (TC) is met. Termination Condition is met when either the Temperature (T) is lower than $T_{cool}$, or if Solution cost does not change for pre-defined number of consecutive Temperatures or iterations. The temperature parameter is used to control the probability of accepting moves. The probability of acceptance is high at higher temperatures, and decreases at lower temperatures. All moves are accepted at higher temperatures initially even though they might be associated with an increased cost. As the temperature lowers, the probability of accepting moves that degrade Placement Solution gets reduced due to Boltzmann's probability distribution (Eqn 2). Subsequently, as the temperature reduces to lower values only moves that reduce the cost (i.e, improved placement configurations) are accepted.

The new temperature in warming phase is computed based on Eqn-3, while new temperature in the cooling phase is computed based on Eqn-4.

$$T_{New}=T*Mult_{Warm} \qquad \text{Eqn-3}$$

$$T_{New}=T*Mult_{Cool} \qquad \text{Eqn-4}$$

Where, $T_{New}$=Temperature of the next Iteration $Mult_{Warm}$=Constant Multiplier selected by the user for warming phase, varies in the range 3–8.

$Mult_{Cool}$=Constant Multiplier, selected by the user for cooling phase, varies in the range 0.6–0.9

At higher temperatures, the probability of accepting moves resulting in increased cost is high, but the probability of accepting such moves gradually reduces as the temperature lowers. It ensures that the search is not confined to local optimal and a global optimal solution is obtained.

Legalization of Placement in PGMCPlace

Performance Group circuit elements are considered as one circuit element that is represented by its Seed Circuit. When SA begins with an initial placement, each performance Group is considered as a single circuit element. The Seed Circuit is placed first to a location after which the stitch is placed next to it. Legalization is a step done during the initial placement and during generating new placement that ensures:

1. circuit element placement does not cross the chip boundary.

2. circuit elements do not overlap with Macro or Fixed Circuits.

The placement slot selection for Performance Group ensures that enough cells are available within the chip boundary in the same row to place both the seed and stitch circuits alongside. If the stitch is falling off the chip boundary, then legalization is required. In Legalization of PGs, the seed's starting cell position is selected such that the Seed+stitch circuits are placed within the chip boundary.

In FIG. 4, the first PG (PG1) is formed by circuit elements CKT3, CKT4 and the $2^{nd}$ PG (PG2) is formed by circuits CKT1, CKT2. The pair of circuit elements of a PG are treated as a single circuit element represented by its Seed Circuit, by the SA process. Thus, CKT3 and CKT1 represent the two PGs formed in the figure. Legal positions (placement slots) are determined for the PGs by making various moves. First, the seed circuit is moved to a cell position followed by its stitch circuits. Hence, a significant wire length reduction is achieved.

Supposing that for the circuit elements of NET#10 shown in FIG. 4, the Circuit height for all circuit elements (Standard Cell Designs) is 1, whereas the circuit element size (Horizontal circuit width) of CKT1 and CKT3 is 4, and of circuits CKT2 and CKT4 is 2. While moving PG3, if an empty placement slot (or cell number) 356 is found, the seed CKT3 will occupy 4 cells, i.e., cell numbers 356 to 359, and the stitch CKT4 will occupy 2 cells from 360 to 361. Wire lengths get reduced because the stitch is placed next to the seed. As the circuit elements in the final placement solution generated by PGMCPlace are closely connected, and closely placed, the wire length between seed-stitch reduces. At the same time, the overall computation time is also reduced because the number of moves required in PGMCplace to bring these well connected circuits to closer slots decreases.

Designers use Global Router after the Placement step to estimate wireability of the design, Global wiring Paths, and Wiring Congestion. The Global Router estimates the routability of the design in terms of congestion (tile edge density) numbers. The designs having higher congestion figure have lower routability, and vice versa. Designs crossing a threshold congestion value (say greater than 80%) will not have 100% routing during detailed routing phase. This threshold is decided based on experience and the type of designs used.

PGMCPlace can be executed either in standalone mode or through ChipBench GUI. If it is executed through ChipBench, it contains a runtime overhead of loading designs, technology Libraries, and bringing-up GUI. The ChipBench tool needs design input in VIM format, whereas PGMCPlace needs design data in MCIN format. ChipPlace contains wrapper programs VIM2place (to convert VIM to MCIN format), and place2VIM (to convert MCIN to VIM format).

Table 1 provides a description of they test cases used to test the PGMCPlace's placement solutions. Designs Des_aqx_vm, and Des_icp_vm shown in the table are in VIM format. These designs are used with ChipBench suite to invoke Global Router and capture congestion figures after PGMCPlace, (or MCPlace) runs. Designs for test cases 1 to 4 are in MCIN format and are used to test PGMCPlace in stand-alone mode.

groups. It is observed that the circuit elements in one cluster group have connecting wires going to different cluster groups of PGs and theses wires are called Global wires.

Figure 5:
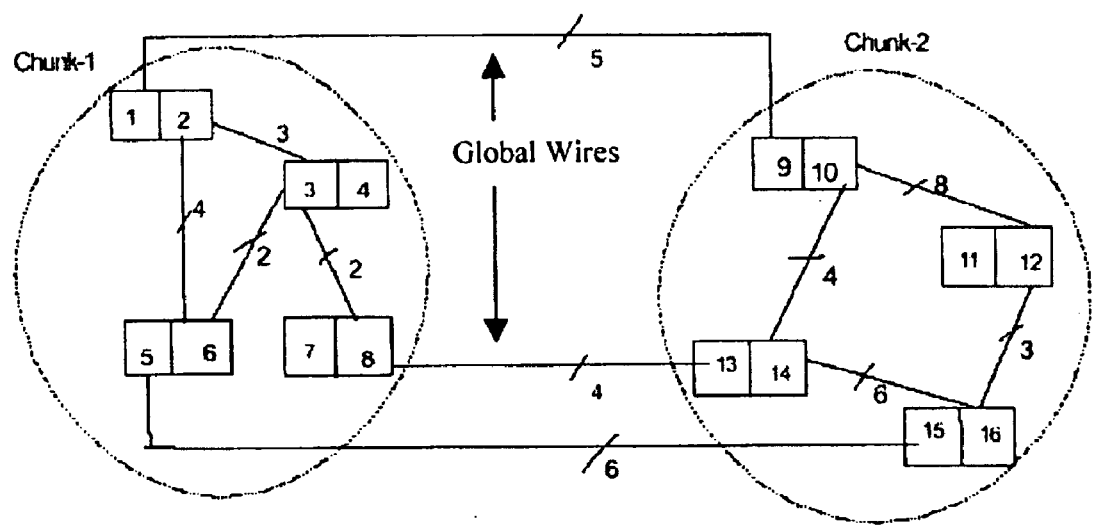
FIG. 5 shows the formation of cluster-groups and congestion in PG based placement.

The occurrence of Global wires is shown in FIG. 5. In the figure, circuit elements 1,2,3,4,5,6,7,8 form cluster group chunk1, and 9,10,11,12,13,14,15,16 form cluster group chunk2. Due to the interconnections between circuit elements in cluster group chunk1 with circuit elements in cluster group chunk2, the Global Router with circuit elements in cluster group chunk2 identifies 15 global-wires across these cluster groups. If the number of circuit elements in a design is very large, then these global wires across the cluster groups pose problems to routability and lead to a higher congestion figure in the Global Router. Hence, the congestion numbers reported by the global router for a PGMCPlace run are higher than those reported for the original MCPlace run.

Figure 6:
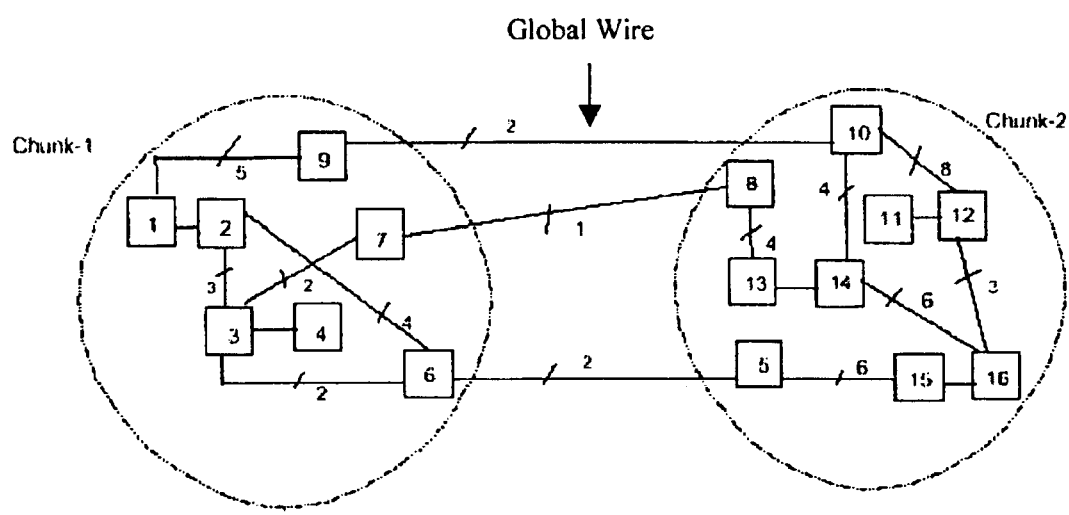
FIG. 6 shows how congestion can be reduced by Un-clustering a PG-based placement.

In FIG. 5, circuit elements 1 and 9 cannot move independently of each other because they are part of PGs. If circuit elements 1,9 can move into one cluster group, i.e. either circuit element 1 moves into cluster-group chunk2 or circuit element 9 moves to cluster-group chunk1, then the Global wires across cluster groups chunk1 to chunk2 reduces to 5. If the circuits in PGs are un-clustered or de-linked, then these circuits can be moved independently of each other. The reduction of congestion as a result of un-clustering of the circuits is shown in FIG. 6.

Un-Clustering de-links the circuits of a PG by making the seed-stitch combination of a PG to be independent circuits. The seed-stitch pair no longer exists, and SA in UnClu_PGMCPlace (Un-Clustering step implemented in PGMCPlace) considers these circuit elements as independent for perturbing. The problem size seen by PGMCPlace increases to its original size after the Un-Clustering step is carried out at a lower threshold temperature of Annealing. The impact of this step on the total runtime is negligible. Thus, at low temperature runs, UnClu_PGMCPlace algo-

TABLE 1

Test Design Description

| S. No. | Test circuit | # Cells | # Nets | # Total circuits | # Macros | # Fixed circuits | # Movable circuits |
|---|---|---|---|---|---|---|---|
| 1 | Des_FOCS | 374000 | 49326 | 49901 | 0 | 8526 | 41375 |
| 2 | Des_SWMR | 958408 | 94785 | 94716 | 10 | 452 | 64254 |
| 3 | Des_AQX | 2809026 | 170481 | 162257 | 102 | 9108 | 153047 |
| 4 | Des_ICP | 7820384 | 321449 | 311287 | 52 | 5194 | 306041 |
| 5 | Des_aqx_vm | 2809026 | 168209 | 159273 | 102 | 12993 | 78047 |
| 6 | Des_icp_vm | 7820384 | 294136 | 284025 | 52 | 4242 | 150057 |
| 7 | Des_CROME | 1404594 | 70624 | 69541 | 14 | 52 | 69475 |
| 8 | Des_CBELT | N/A | 296021 | N/A | N/A | N/A | 269431 |

The congestion figures obtained are reported in Table 2 (given later in the specification). The result shows that the congestion figure obtained with PGMCPlace run is higher than that obtained with the MCPlace tool. The reason may be that during the process of PG formation, circuit elements having larger local-net-number are tightly grouped as one PG-circuit and are placed closely as cluster-group of PGs (chunks). A chunk refers to a group of PGs that are placed in placement slots closely. The Placement pattern obtained for designs using PGMCPlace indicates that the circuit elements are distributed as chunks.

Groups of PGs having high connectivity are placed closely during annealing process and these PGs come close as though a force of attraction is exerted because of the connectivity that pulls them together. Therefore, cluster-groups of PGs are obtained after placement. The circuit elements in one cluster-group can have connectivity with the circuit elements in other PGs placed in separate cluster rithm allows circuit elements to move into their natural placement slots and helps to reduce the congestion figure. These results have been verified using congestion figures obtained in Global router after UnClu_PGMCPlace runs, as shown in Table 2.

TABLE 2

Congestion figure comparison among
MCPlace, PGMCPlace and UnClu_PGMCPlace

| Testcase | MCPlace | PG MCPlace | UnClu_PG MCPlace |
|---|---|---|---|
| Des_aqx_vm | 75.48 | 77.69 | 77.34 |
| Des_icp_vm | 69.64 | 72.73 | 66.41 |

Run time Performance comparison between MCPlace and PGMCPlace is reported in Table 3. It can be observed from the table that for large test cases, PGMCPlace leads to a run time reduction of upto 25% and final placement quality improvement of around 15% to 42% as compared to MCPlace runs without Performance Groups. The run time reduction in PGMCPlace compared to MCPlace is proportional to the reduction in the number of movable circuit elements seen by PGMCPlace.

TABLE 3

Performance comparison between PGMCPlace and MCPlace

| Test Case | MCKT Count in MCPlace | Placement score in MCPlace | Run Time in MCPlace | MCKT in PGMCPlace | PG Count | Placement score in PGMCPlace | Run Time PGMCPlace |
|---|---|---|---|---|---|---|---|
| Des_FOCS | 41375 | 71.70 | 1H 15M 42S | 22733 | 18642 | 99.84 | 0H 52M 10S |
| Des_SWMR | 64254 | 787.18 | 7H 15M 6S | 50942 | 43312 | 733.60 | 6H 22M 03S |
| Des_AQX | 153047 | 14534.90 | 8H 59M 47S | 85746 | 71122 | 13649.17 | 5H 42M 33S |
| Des_ICP | 306041 | 84462 | 25H 26M 15S | 172211 | 141517 | 51243.01 | 17H 41M 30S |
| Des_CROME | 69475 | 424.40 | 3H 36M 43S | 37676 | 31813 | 532.11 | 3H 3M 25S |
| Des_CBELT | 269431 | NA | 22H 0M 0S | NA | NA | NA | 13H 30M 0S |

The quality comparison among MCPlace, PGMCPlace and UnClu_PGMCPlace is given the Table 4:

TABLE 4

Placement Quality comparison among MCPlace, PGMCPlace and UnClu_PGMCPlace

| | Placement score in | | |
|---|---|---|---|
| Testcase | MCPlace | PG MCPlace | UnClu_PG MCPlace |
| Des_FOCS | 71.70 | 99.84 | 75.96 |
| Des_SWMR | 787.18 | 733.60 | 610.40 |
| Des_AQX | 14534.90 | 13087.67 | 12709.95 |
| Des_ICP | 84462.99 | 53313.54 | 48744.76 |

The runtime performance comparison among MCPlace, PGMCPlace and UnClu_PG MCPlace is given the Table 5 below:

TABLE 5

Runtime Performance Comparison among MCPlace, PGMCPlace and UnClu_PGMCPlace

| Test Case | MCKT in MCPlace | Run Time in MCPlace | MCKT in PBMCPlace | PG Count | Run Time PGMCPlace | Run Time Unclu_PGMCPlace |
|---|---|---|---|---|---|---|
| Des_FOCS | 41375 | 1H 15M 42S | 22733 | 18642 | 0H 52M 10S | 1H 0M 26S |
| Des_SWMR | 64254 | 7H 15M 6S | 50942 | 43312 | 6H 30M 45S | 5H 29M 06S |
| Des_AQX | 153047 | 8H 59M 47S | 85746 | 71122 | 6H 54M 51S | 6H 58M 11S |
| Des_ICP | 306041 | 25H 26M 15S | 172211 | 141517 | 17H 41M 30S | 19H 10M 32S |

It will be apparent to those with ordinary skill in the art that the foregoing is merely illustrative and not intended to be exhaustive or limiting, having been presented by way of example only and that various modifications can be made within the scope of the above invention. The present invention can be realised in hardware, software or a combination of hardware and software. Any kind of computer system or other apparatus adapted for carrying out the methods described herein is suited. A typical combination of hardware and software could be a general purpose computer system with a computer program that, when loaded and executed, controls the computer system such that it carries out the methods described herein.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. A method for VLSI circuit placement providing improved quality and enhanced speed, comprising the steps of:
   a. defining a target objective cost function and an initial value for a control parameter for circuit placement,
   b. grouping selected circuit elements of the VLSI circuit to form performance groups,
   c. selecting an initial placement configuration of the performance groups,
   d. increasing the value of the initial control parameter to a predetermined level,
   e. perturbing the placement configuration randomly to get a new configuration,
   f. determining an objective cost of the new configuration using the objective cost-function, g. accepting the new configuration when it has a lower objective cost as compared to the previous configuration, otherwise probabilistically accepting the new configuration when it has a higher objective cost, h. decreasing the value of the control parameter, and i. repeating steps (e) to (h) until a configuration having a lower objective cost is not detected for a predetermined number of iterations.

2. The method as claimed in claim 1 further comprising legalization of performance groups in the final placement configuration.

3. The method as claimed in claim 1 further comprising the step of unclustering the circuit elements of selected performance groups in order to reduce the congestion of the placement.

4. The method as claimed in claim 1 wherein the initial placement configuration of the performance groups is chosen based on the initial control parameter.

5. The method as claimed in claim 1 wherein the value of the control parameter is increased and decreased according to warming and cooling schedules respectively.

6. The method as claimed in claim 1 wherein the step of perturbing the placement configuration of the performance groups comprises the step of altering a configuration of randomly selected circuits elements.

7. The method as claimed in claim 1 wherein the step of forming performance groups comprises the steps of:

creating a first array containing information pertaining to connectivity of nets of the circuit elements;

creating a second array containing information pertaining to all the circuit pairs of the nets in the first array including local-net-counts of the nets;

sorting the second array in descending order of the local-net-counts; and forming performance groups using circuit pairs of the second array based on predetermined conditions.

8. The method as claimed in claim 7 wherein the circuit elements of each performance group are treated as a single circuit for perturbing, the circuit elements of a performance group being represented by one of the circuit elements of the performance group.

9. The method as claimed in claim 7 wherein a circuit element can be a part of only one performance group at one time.

10. The method as claimed in claim 7 wherein a circuit element that is a part of a performance group cannot participate further in performance group formation.

11. The method as claimed in claim 7 wherein a circuit element can be a part of more than one net.

12. A system for VLSI circuit placement, comprising:

a processor and a storage device, wherein the storage device stores certain computer software and the processor is operable to access the computer software from the storage device and in response to the computer software to perform functions comprising:

a. defining a target objective cost function and an initial value for a control parameter for circuit placement;

b. grouping selected circuit elements of the VLSI circuit to form performance groups;

c. selecting an initial placement configuration of the performance groups;

d. increasing the value of the initial control parameter to a predetermined level;

e. perturbing the placement configuration randomly to get a new configuration;

f. determining an objective cost of the new configuration using the objective cost-function;

g. accepting the new configuration when it has a lower objective cost as compared to the previous configuration, otherwise probabilistically accepting the new configuration when it has a higher objective cost;

h. decreasing the value of the control parameter; and i. repeating steps (e) to (h) until a configuration having a lower objective cost is not detected for a predetermined number of iterations.

13. The system as claimed in claim 12 wherein the functions that the processor is operable to perform in response to the computer software comprise legalizing performance groups in the final placement configuration.

14. The system as claimed in claim 12 wherein the functions that the processor is operable to perform in response to the computer software comprise unclustering the circuit elements of selected performance groups in order to reduce the congestion of the placement.

15. The system as claimed in claim 12 wherein the initial placement configuration of the performance groups is chosen based on the initial control parameter.

16. The system as claimed in claim 12 wherein the value of the control parameter is increased and decreased according to warming and cooling schedules respectively.

17. The system as claimed in claim 12 wherein the perturbing of the placement configuration of the performance groups comprises altering a configuration of randomly selected circuits elements.

18. The system as claimed in claim 12 wherein forming performance groups comprises:

creating a first array containing information pertaining to connectivity of nets of the circuit elements;

creating a second array containing information pertaining to all the circuit pairs of the nets in the first array including local-net-counts of the nets;

sorting the second array in descending order of the local-net-counts; and forming performance groups using circuit pairs of the second array based on predetermined conditions.

19. The system as claimed in claim 18 wherein the circuit elements of each performance group are treated as a single circuit for perturbing, the circuit elements of a performance group being represented by one of the circuit elements of the performance group.

20. The system as claimed in claim 18 wherein a circuit element can be a part of only one performance group at one time.

21. The system as claimed in claim 18 wherein a circuit element that is a part of a performance group cannot participate further in performance group formation.

22. The system as claimed in claim 18 wherein a circuit element can be a part of more than one net.

23. A computer program product comprising computer readable program code stored on computer readable storage medium embodied therein for VLSI circuit placement providing improved quality and enhanced speed, comprising:

computer readable program code means configured for defining a target objective cost function and an initial value for a control parameter for circuit placement;

computer readable program code means configured for grouping selected circuit elements of the VLSI circuit to form performance groups;

computer readable program code means configured for selecting an initial placement configuration of the performance groups;

computer readable program code means configured for increasing the value of the initial control parameter to a predetermined level;

computer readable program code means configured for perturbing the placement configuration randomly to get a new configuration;

computer readable program code means configured for determining an objective cost of the new configuration using the objective cost-function;

computer readable program code means configured for accepting the new configuration when it has a lower objective cost as compared to the previous configuration, otherwise probabilistically accepting the new configuration when it has a higher objective cost;

computer readable program code means configured for decreasing the value of the control parameter; and computer readable program code means configured for repeating steps (e) to (h) until a configuration having a lower objective cost is not detected for a predetermined number of iterations.

24. The computer program product as claimed in claim 23 comprising computer readable program code means configured for legalizing performance groups in the final placement configuration.

25. The computer program product as claimed in claim 23 comprising computer readable program code means configured for unclustering the circuit elements of selected performance groups in order to reduce the congestion of the placement.

26. The computer program product as claimed in claim 23 wherein the initial placement configuration of the performance groups is chosen based on the initial control parameter.

27. The computer program product as claimed in claim 23 wherein the value of the control parameter is increased and decreased according to warming and cooling schedules respectively.

28. The computer program product as claimed in claim 23 wherein perturbing the placement configuration of the performance groups comprises altering a configuration of randomly selected circuits elements.

29. The computer program product as claimed in claim 23 wherein forming performance groups comprises:

creating a first array containing information pertaining to connectivity of nets of the circuit elements;

creating a second array containing information pertaining to all the circuit pairs of the nets in the first array including local-net-counts of the nets;

sorting the second array in descending order of the local-net-counts; and forming performance groups using circuit pairs of the second array based on predetermined conditions.

30. The computer program product as claimed in claim 29 wherein the circuit elements of each performance group are treated as a single circuit for perturbing, the circuit elements of a performance group being represented by one of the circuit elements of the performance group.

31. The computer program product as claimed in claim 29 wherein a circuit element can be a part of only one performance group at one time.

32. The computer program product as claimed in claim 29 wherein a circuit element that is a part of a performance group cannot participate further in performance group formation.

33. The computer program product as claimed in claim 29 wherein a circuit element can be a part of more than one net.

* * * * *